United States Patent
Zhang et al.

(10) Patent No.: US 12,178,036 B2
(45) Date of Patent: Dec. 24, 2024

(54) METHOD FOR FORMING MEMORY AND MEMORY

(71) Applicant: CHANGXIN MEMORY TECHNOLOGIES, INC., Anhui (CN)

(72) Inventors: Lintao Zhang, Hefei (CN); Thomas Jongwan Kwon, Hefei (CN); Lingguo Zhang, Hefei (CN); Xu Liu, Hefei (CN); Xiangui Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 663 days.

(21) Appl. No.: 17/371,267

(22) Filed: Jul. 9, 2021

(65) Prior Publication Data
US 2021/0398984 A1 Dec. 23, 2021

Related U.S. Application Data

(63) Continuation of application No. PCT/CN2020/115396, filed on Sep. 15, 2020.

(30) Foreign Application Priority Data

Jun. 22, 2020 (CN) .......................... 202010575406.8

(51) Int. Cl.
*H01L 27/108* (2006.01)
*G11C 5/06* (2006.01)
(Continued)

(52) U.S. Cl.
CPC ........... *H10B 12/482* (2023.02); *G11C 5/063* (2013.01); *G11C 11/4097* (2013.01); *H10B 12/485* (2023.02); *H10B 12/488* (2023.02)

(58) Field of Classification Search
CPC .... H10B 12/482; H10B 12/485; G11C 5/063; G11C 11/4097
See application file for complete search history.

(56) References Cited

U.S. PATENT DOCUMENTS 7,494,871 B2   2/2009   Lee
8,026,547 B2   9/2011   Kim
(Continued)

FOREIGN PATENT DOCUMENTS

CN    101043035 A     9/2007
CN    101552276 A    10/2009
(Continued)

OTHER PUBLICATIONS

Machine translation, Oh, Korean Pat. Pub. No. KR20090111051A, Espacenet, translation date: Aug. 20, 2024, all pages. (Year: 2024).*

(Continued)

*Primary Examiner* — Victoria K. Hall
(74) *Attorney, Agent, or Firm* — Syncoda LLC; Feng Ma

(57) ABSTRACT

A method for forming a memory device includes: providing a substrate including at least word line structures and active regions, and a bottom dielectric layer and bit line contact layers that are on a top surface of the substrate; part of the bit line contact layers are etched to form bit line contact layers at different heights; conducting layers are formed, top surfaces of the conducting layers being at different heights in a direction perpendicular to an extension direction of the word line structure, and the top surfaces of the conducting layers being at different heights in the extension direction of the word line structure; top dielectric layers are formed; and etching is performed to form separate bit line structures.

7 Claims, 15 Drawing Sheets

(51) Int. Cl.
  *G11C 11/4097* (2006.01)
  *H10B 12/00* (2023.01)

(56) References Cited

U.S. PATENT DOCUMENTS

| | | | |
|---|---|---|---|
| 8,273,652 | B2 | 9/2012 | Kim |
| 8,507,980 | B2 | 8/2013 | Kim |
| 9,012,326 | B2 | 4/2015 | Kim |
| 10,461,153 | B2 | 10/2019 | Lee et al. |
| 10,885,956 | B2 | 1/2021 | Liu |
| 2004/0137743 | A1 | 7/2004 | Chung |
| 2007/0224758 | A1 | 9/2007 | Park |
| 2008/0081413 | A1 | 4/2008 | Lee |
| 2009/0250743 | A1 | 10/2009 | Kim |
| 2011/0159686 | A1 | 6/2011 | Jung |
| 2011/0195551 | A1 * | 8/2011 | Kim ............... H10B 12/315 438/270 |
| 2011/0278668 | A1 | 11/2011 | Kim |
| 2012/0021595 | A1 | 1/2012 | Kim |
| 2012/0040528 | A1 | 2/2012 | Kim |
| 2019/0088739 | A1 | 3/2019 | Lee et al. |
| 2019/0139963 | A1 * | 5/2019 | Hong ............... H10B 12/315 |
| 2020/0279594 | A1 | 9/2020 | Liu |
| 2021/0091086 | A1 | 3/2021 | Hong et al. |
| 2022/0328494 | A1 * | 10/2022 | Zhang ............... H10B 12/482 |

FOREIGN PATENT DOCUMENTS

| | | | | |
|---|---|---|---|---|
| CN | 102148197 | A | 8/2011 | |
| CN | 107910330 | A | 4/2018 | |
| CN | 208368506 | U * | 1/2019 | .......... H01L 27/108 |
| CN | 109524383 | A | 3/2019 | |
| CN | 110556359 | A * | 12/2019 | ............... G11C 7/18 |
| CN | 210325787 | U * | 4/2020 | ............... G11C 7/18 |
| KR | 1020090111050 | A * | 10/2009 | ....... H01L 21/76816 |
| KR | 1020090111051 | A * | 10/2009 | .......... H10B 12/485 |
| TW | 291700 | B | 12/2007 | |

OTHER PUBLICATIONS

Machine translation, Kim, Korean Pat. Pub. No. KR20090111050A, Espacenet, translation date: Aug. 20, 2024, all pages. (Year: 2024).*

Machine translation, Zhan, Chinese Pat. Pub. No. CN210325787U, Clarivate Analytics, translation date: Aug. 20, 2024, all pages. (Year: 2024).*

Machine translation, Zhan, Chinese Pat. Pub. No. CN110556359A, Clarivate Analytics, translation date: Aug. 20, 2024, all pages. (Year: 2024).*

Machine translation, Anonymous Inventor, Chinese Pat. Pub. No. CN208368506U, Espacenet, translation date: Feb. 12, 2024, all pages. (Year: 2024).*

International Searching Authority, International Search Report, International application No. PCT/CN2020/115396, Mar. 5, 2021, all pages. (Year: 2021).*

International Searching Authority, Written Opinion of the International Searching Authority, International application No. PCT/CN2020/115396, Mar. 5, 2021, all pages. (Year: 2021).*

International Searching Authority, Written Opinion of the International Searching Authority, International application No. PCT/CN2020/115398, Mar. 17, 2021, all pages. (Year: 2021).*

International Search Report in the international application No. PCT/CN2020/115396, mailed on Mar. 5, 2021.

International Search Report in the international application No. PCT/CN2020/115398, mailed on Mar. 17, 2021.

US office action in U.S. Appl. No. 17/601,494, mailed on Jul. 8, 2024.

* cited by examiner

Cross section along the dotted line 30:

Cross section along the dotted line 31:

METHOD FOR FORMING MEMORY AND MEMORY

CROSS-REFERENCE TO RELATED APPLICATIONS

This application is a continuation of International Application No. PCT/CN2020/115396 filed on Sep. 15, 2020, which claims priority to Chinese Patent Application No. 202010575406.8 filed on Jun. 22, 2020. The disclosures of these applications are hereby incorporated by reference in their entirety.

BACKGROUND

With the decrease of a feature size and line width of a Dynamic Random-Access Memory (DRAM), a distance between adjacent bit line structures also continues to decrease.

SUMMARY

The disclosure relates generally to the technical field of semiconductors, and more specifically to a method for forming a memory and a memory.

Some embodiments of the disclosure are intended to provide a method for forming a memory and a memory. Conducting layers in bit line structures are formed at different heights to increase distances between the conducting layers in the bit line structures without changing an arrangement manner for the bit line structures.

The embodiments of the disclosure provide a method for forming a memory, which may include that: providing a substrate, in which at least word line structures and active regions are included; forming the bottom dielectric layer with bit line contact openings, the bit line contact openings exposing the active regions in the substrate; forming bit line contact layer, the bit line contact layer covering the bottom dielectric layer and filling the bit line contact openings; etching the bit line contact layer, a remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights; forming conducting layers on a top surface of the remaining bit line contact layer, top surfaces of the conducting layers being at different heights in a direction perpendicular to an extension direction of the word line structures and a plane of the substrate, and the top surfaces of the conducting layers being at different heights in the extension direction of the word line structures; forming a top dielectric layer on the top surfaces of the conducting layers; and sequentially etching the top dielectric layer, the conducting layers and the remaining bit line contact layer to form separate bit line structures; wherein etching the bit line contact layer, the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions includes have different heights: forming first photolithographic mask layer on the top surface of the bit line contact layer; patterning the first photolithographic mask layer to form spaced patterns extending in a preset direction, the preset direction forming an included angle α with the extension direction of the word line structures, and a range of a being 0°<α<90°; etching the bit line contact layer based on the spaced patterns, the remaining bit line contact layer above the bottom dielectric layer is the first remaining bit line contact layer and the remaining bit line contact layer above the active regions is the second remaining bit line contact layer, the first remaining bit line contact layer above the bottom dielectric layer and the second remaining bit line contact layer above the active regions have different heights; and removing the spaced patterns; or forming second photolithographic mask layers on a top surface of the bit line contact layer, the second photolithographic mask layers being in the extension direction of the word line structures, and there being gaps formed between adjacent second photolithographic mask layers in the direction perpendicular to the extension direction of the word line structures, wherein the gap exposes part of the bit line contact layer and spaces between at least two columns of word line structures; etching part of the bit line contact layer based on the gaps, the remaining bit line contact layer above the bottom dielectric layer is the first remaining bit line contact layer and the remaining bit line contact layer above the active regions is the second remaining bit line contact layer, the first remaining bit line contact layer above the bottom dielectric layer hand the second remaining bit line contact layer above the active regions have different heights; and removing the second photolithographic mask layers.

The embodiments of the disclosure also provide a memory, which may include: a substrate, at least word line structures and active regions being included in the substrate; a bottom dielectric layer, the bottom dielectric layer being at a top surface of the substrate, bit line contact openings being provided in the bottom dielectric layer; and separate bit line structures, top surfaces of the bit line structures being at the same height, and each the bit line structure comprising a bit line contact layer at a top surface of the bottom dielectric layer and in the bit line contact opening, a conducting layer at a top surface of the bit line contact layer, and a top dielectric layer at a top surface of the conducting layer, wherein a height of the conducting layer in a same bit line structure waving up and down perpendicular to the plane of the substrate in an extension direction of the bit line structure, and conducting layers in adjacent bit line structures are at different heights and a connecting line of the conducting layers in different bit line structures is a wavy shape in an extension direction of the word line structures; wherein the memory is prepared with the steps of: providing a substrate, in which at least word line structures and active regions are included; forming the bottom dielectric layer with bit line contact openings, the bit line contact openings exposing the active regions in the substrate; forming bit line contact layer, the bit line contact layer covering the bottom dielectric layer and filling the bit line contact openings; etching the bit line contact layer, a remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights; forming conducting layers on a top surface of the remaining bit line contact layer, top surfaces of the conducting layers being at different heights in a direction perpendicular to an extension direction of the word line structures and a plane of the substrate, and the top surfaces of the conducting layers being at different heights in the extension direction of the word line structures; forming a top dielectric layer on the top surfaces of the conducting layers; and sequentially etching the top dielectric layer, the conducting layers and the remaining bit line contact layer to form separate bit line structures; wherein etching the bit line contact layer, the remaining bit line contact layer includes a first remaining bit line contact layer above the bottom dielectric layer and a second remaining bit line contact layer above the active regions, and the first remaining bit line contact layer above the bottom dielectric layer hand the second remaining bit line contact layer above the active regions have different heights includes: forming first photolithographic mask layer on a top surface of the bit line contact layer; patterning the first photolithographic mask layer to form spaced patterns extending in a preset direction, the preset direction forming an included angle α with the extension direction of the word line structures, and a range of a being 0°<α<90°; etching the bit line contact layer based on the spaced patterns, the remaining bit line contact layer above the bottom dielectric layer is the first remaining bit line contact layer and the remaining bit line contact layer above the active regions is the second remaining bit line contact layer, the first remaining bit line contact layer above the bottom dielectric layer and the second remaining bit line contact layer above the active regions have different heights; and removing the spaced patterns; or forming second photolithographic mask layers on a top surface of the bit line contact layer, the second photolithographic mask layers being in the extension direction of the word line structures, and there being gaps formed between adjacent second photolithographic mask layers in the direction perpendicular to the extension direction of the word line structures, wherein the gap exposes part of the bit line contact layer and spaces between at least two columns of word line structures; etching part of the bit line contact layer based on the gaps, the remaining bit line contact layer above the bottom dielectric layer is the first remaining bit line contact layer and the remaining bit line contact layer above the active regions is the second remaining bit line contact layer, the first remaining bit line contact layer above the bottom dielectric layer and the second remaining bit line contact layer above the active regions have different heights; and removing the second photolithographic mask layers.

BRIEF DESCRIPTION OF THE DRAWINGS

Exemplary descriptions are made to one or more embodiments through the figures in the corresponding accompanying drawings. Unless otherwise specified, the pictures in the accompanying drawings do not form scale limits.

DETAILED DESCRIPTION

Figure 1:
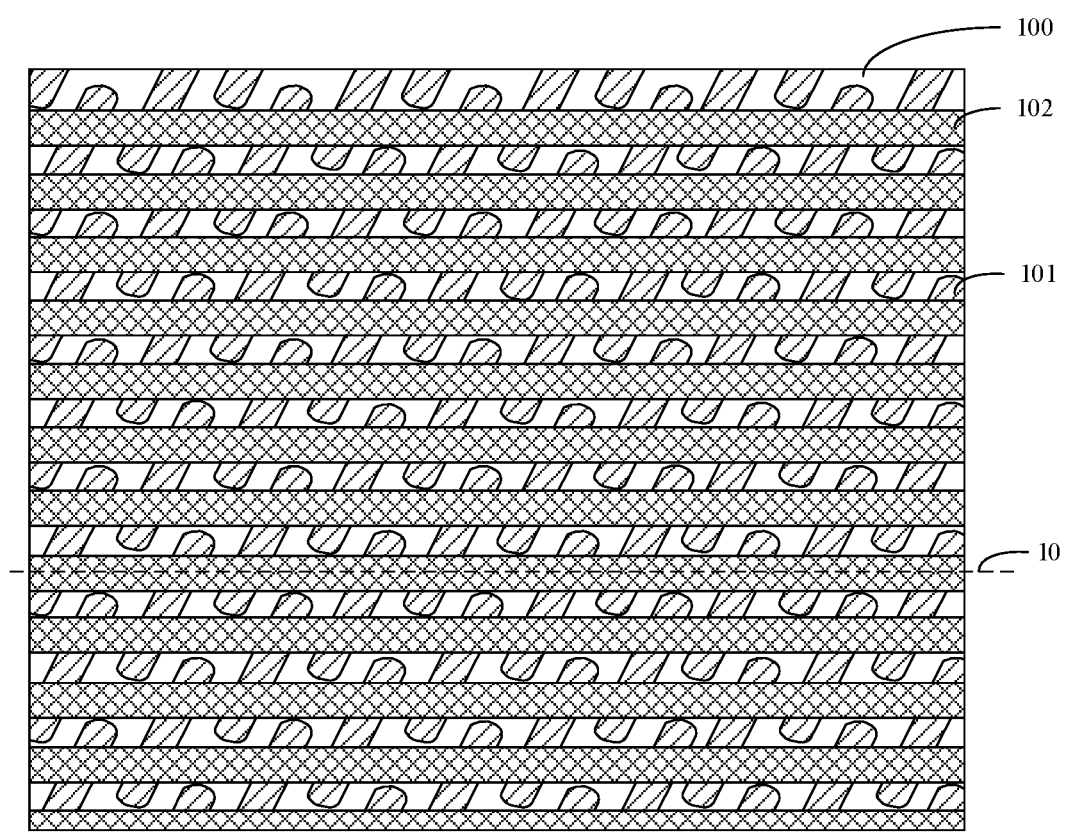
FIG. 1 illustrates a first structure diagram corresponding to one or more steps of a method for forming a memory according to a first embodiment of the disclosure.

Decrease of the distance between the adjacent bit line structures may cause increase of parasitic capacitance between the adjacent bit line structures, affect a saturation current of an array area of the DRAM, and further affect the running efficiency of the DRAM.

Various embodiments of the present disclosure can address problems associated with when a line width of a DRAM constantly decreases, how to increase a distance between bit line structures.

For making the objectives, technical solutions and advantages of the disclosure clearer, part of embodiments of the disclosure will further be described below in detail in combination with the drawings and the examples. It should be understood that specific examples described here are only adopted to explain the disclosure and not intended to limit the disclosure.

A first embodiment of the disclosure relates to a method for forming a memory, which includes the following steps. A substrate is provided, at least word line structures and active regions are included in the substrate; forming the bottom dielectric layer with bit line contact openings, the bit line contact openings exposing the active regions in the substrate; forming bit line contact layer, the bit line contact layer covering the bottom dielectric layer and filling the bit line contact openings; etching the bit line contact layer, the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights; forming conducting layers on top surfaces of the remaining bit line contact layer, respective top surfaces of the conducting layers being at different heights in a direction perpendicular to an extension direction of the word line structure and the plane of the substrate, and the top surfaces of the conducting layers being at different heights in the extension direction of the word line structure; forming a top dielectric layer on the top surfaces of the conducting layers; and sequentially etching the top dielectric layer, the conducting layers and the remaining bit line contact layer to form separate bit line structures.

FIG. 1 to FIG. 12 illustrate structure diagrams corresponding to each step of a method for forming a memory according to a first embodiment of the disclosure. The method for forming a memory of the embodiment will be specifically described below.

Referring to FIG. 1 to FIG. 5, a substrate 100 is provided. At least word line structures 102 and active regions 101 are included in the substrate 100, a bottom dielectric layer 110 is provided on a top surface of the substrate 100, and bit line contact openings 111 are provided in the dielectric layer. Bit line contact layer 120 is formed, covering the bottom dielectric layer 110 and fill the bit line contact openings 111.

FIG. 1 to FIG. 5 will be described below in detail in combination with the drawings.

Referring to FIG. 1, the substrate 100 is provided. At least the word line structures 102 and the active regions 101 are included in the substrate 100.

FIG. 1 shows an extension direction 10 of the word line structure, i.e., the dotted line 10 in the figure.

Multiple active regions 101 are spaced in parallel. The active regions 101 of an $i^{th}$ column and the active regions 101 of an $(i+3)^{th}$ column are at the same horizontal position in a direction perpendicular to the extension direction 10 of the word line structure. The active regions 101 of the $i^{th}$ column and the active regions 101 of adjacent columns (the $(i+1)^{th}$ column and an $(i-1)^{th}$ column) are at different horizontal positions in the direction perpendicular to the extension direction 10 of the word line structure. Bit line contact points are formed at middle portions of the active regions 101 spaced by the alternately arranged word line structures 102, and are used to connect bit line structures that are subsequently formed.

It is to be noted that other memory structures, except the word line structures 102 and the active regions 101, are also included in the substrate 100, such as shallow trench isolation structures, etc. The other memory structures do not involve the core technology of the disclosure, and will not be elaborated herein. Those skilled in the art can understood that the other memory structures for normal running of the memory, except the word line structures 102 and the active regions 101, may also be included in the substrate 100.

A material for the substrate 100 may include sapphire, silicon, silicon carbide, gallium arsenide, aluminum nitride, zinc oxide, etc. In the embodiment, the substrate 100 is formed from silicon. Those skilled in the art knows that silicon is used as the substrate 100 in the embodiment for a purpose of making it convenient for those skilled in the art to understand the subsequent forming method, no limits are formed, and a suitable material may be selected as the substrate as required in a practical application process.

Referring to FIG. 2 to FIG. 5, the bottom dielectric layer 110 is formed on the top surface of the substrate 100, the bit line contact openings 111 are provided in the bottom dielectric layer 110, the bit line contact openings 111 expose the active regions 101 in the substrate 100, and the bit line contact layer 120 covers the bottom dielectric layer 110 and fills the bit line contact openings 111.

Figure 2:
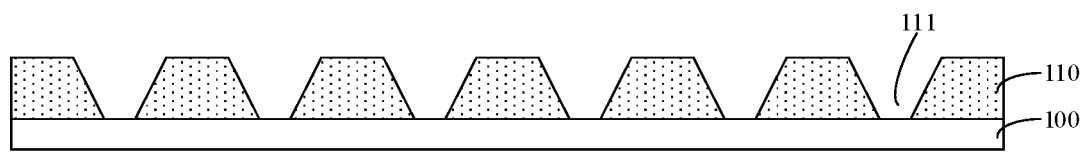
FIG. 2 illustrates a second structure diagram corresponding to one or more steps of a method for forming a memory according to the first embodiment of the disclosure.

Referring to FIG. 2, the bottom dielectric layer 110 is formed on the top surface of the substrate 100, the bit line contact openings 111 are provided in the bottom dielectric layer 110, and the bit line contact openings 111 are formed to expose the active regions 101 in the substrate 100. Specifically, the bit line contact openings 111 are formed to expose bit line contact points, namely exposing middle portions of the active regions 101 spaced by the word line structures 102.

The bottom dielectric layer 110 is used to isolate the active regions 101 from contacting the bit line structures 200, except for the bit line contact points. In the embodiment, a material for the bottom dielectric layer is silicon nitride. In another embodiment, the material for the bottom dielectric layer may also be an insulating material such as silicon oxide or silicon oxynitride.

Figure 3:
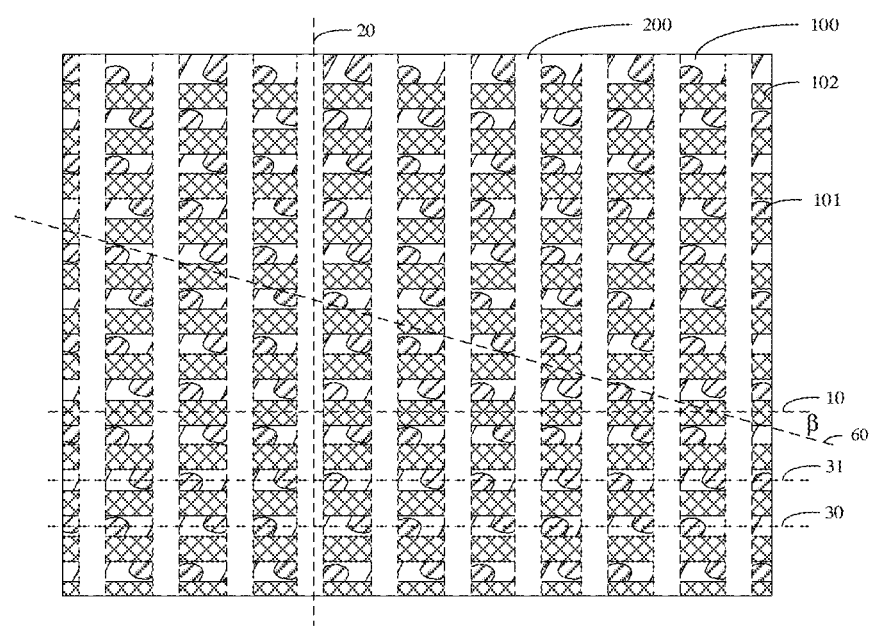
FIG. 3 illustrates a third structure diagram corresponding to one or more steps of a method for forming a memory according to the first embodiment of the disclosure.

Referring to FIG. 3, FIG. 3 is a top view of the substrate 100. FIG. 3 presents positions where the bit line structures 200 are required to be subsequently formed based on formation of the bottom dielectric layer in FIG. 2. FIG. 3 shows an extension direction 20 of the bit line structure, i.e., the dotted line 20 in the figure. The bit line structure 200 is connected with the bit line contact points of the active regions 101 of a column.

Figure 4:
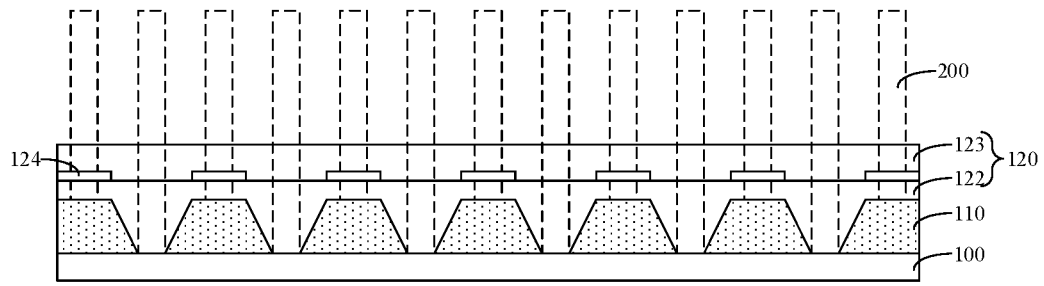
FIG. 4 illustrates a fourth structure diagram corresponding to one or more steps of a method for forming a memory according to the first embodiment of the disclosure.

Referring to FIG. 4, the bit line contact layer 120 is formed on the top surface of the substrate 100, and the bit line contact layer 120 cover the bottom dielectric layer 110 and fill the bit line contact openings 111. FIG. 4 presents positions where the bit line structures are required to be subsequently formed. In any section in the extension direction 10 of the word line structure, bit lines connected with the active regions 101 and bit lines on the bottom dielectric layer 110 are alternately arranged.

In the embodiment, the bit line contact layer 120 includes a first bit line contact layer 122 and a second bit line contact layer 123. Specifically, the first bit line contact layer 122 filling the bit line contact opening 111 is formed, the first bit line contact layer 122 covering the bottom dielectric layer 110. A barrier layer 124 is formed on a top surface of the first bit line contact layer 122 at a top of the bottom dielectric layer 110. The second bit line contact layer 123 is formed on a top surface of the barrier layer 124 and the top surface of the first bit line contact layer 122, the second bit line contact layer 123 covering the first bit line contact layer 122 and the barrier layer 124. The barrier layers 124 are formed in the bit line contact layer 120 in a manner that the conducting layers subsequently formed by etching in the bit line structures at the top of the bottom dielectric layer are at the same height as the barrier layers, so that height differences between the conducting layers in different bit line structures are reduced, a connecting line of the conducting layers is wavy shape, and furthermore, the structural stability of the formed memory is improved.

In the embodiment, a material for the barrier layer 124 is the same as that for the bottom dielectric layer 110. In another embodiment, it is only necessary to ensure that the material for the barrier layer is different from a material for the bit line contact layer to ensure that the barrier layer not being etched when the bit line contact layer is etched. In addition, in the embodiment, both the first bit line contact layer 122 and the second bit line contact layer 123 use a polysilicon material, and are used to connect the subsequently formed bit line structures 200 with the active regions 101 in the substrate through the bit line contact openings 111.

It is to be noted that, in another embodiment, the bit line contact layer 120 may also be formed by a single-layer structure. The specific layer number of the bit line contact layer 120 is not limited in the embodiment. Those skilled in the art can know that the multilayer structure solution provided in the abovementioned embodiment is intended to ensure that height differences between the subsequently formed conducting layers at different heights are relatively small and the connecting line of the conducting layers is a wavy shape to improve the stability of the memory.

Referring to FIG. 5 to FIG. 8, part of the bit line contact layer 120 is etched, the remaining bit line contact layer 121 includes the first remaining bit line contact layer 1211 above the bottom dielectric layer 110 and the second remaining bit line contact layer 1212 above the active regions, and the first remaining bit line contact layer 1211 above the bottom dielectric layer 110 and the second remaining bit line contact layer 1212 above the active regions have different heights.

A reason for forming the bit line contact layer 121 having different heights includes that the bit line contact layer 121 is used to ensure that the conducting layers are at different heights after the conducting layers are subsequently formed.

Figure 5:
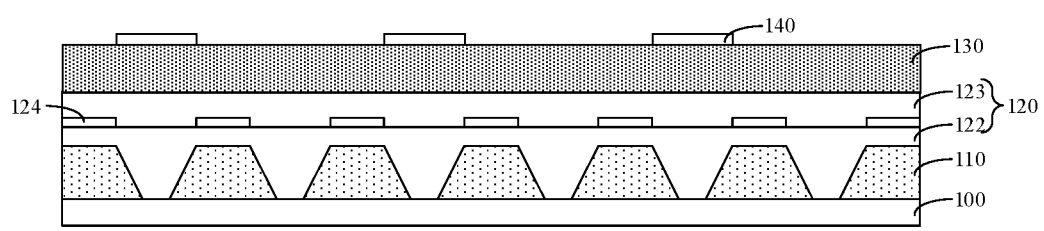
FIG. 5 illustrates a fifth structure diagram corresponding to one or more steps of a method for forming a memory according to the first embodiment of the disclosure.

Specifically, referring to FIG. 5, a first photolithographic mask layer 130 is formed on top surface of the bit line contact layer 120, and a photoresist 140 is formed on a top surface of the first photolithographic mask layer 130.

Figure 6:
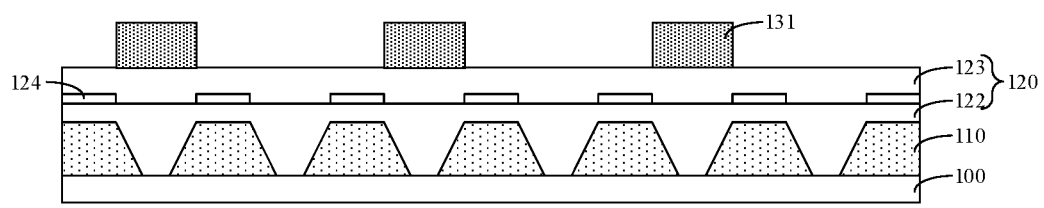
FIG. 6 illustrates a sixth structure diagram corresponding to one or more steps of a method for forming a memory according to the first embodiment of the disclosure.

Referring to FIG. 6, the first photolithographic mask layer 130 is patterned to form spaced patterns 131 in a first preset direction. The spaced patterns 131 include spaced and extending strips, or separate ellipses or rectangles.

Figure 7:
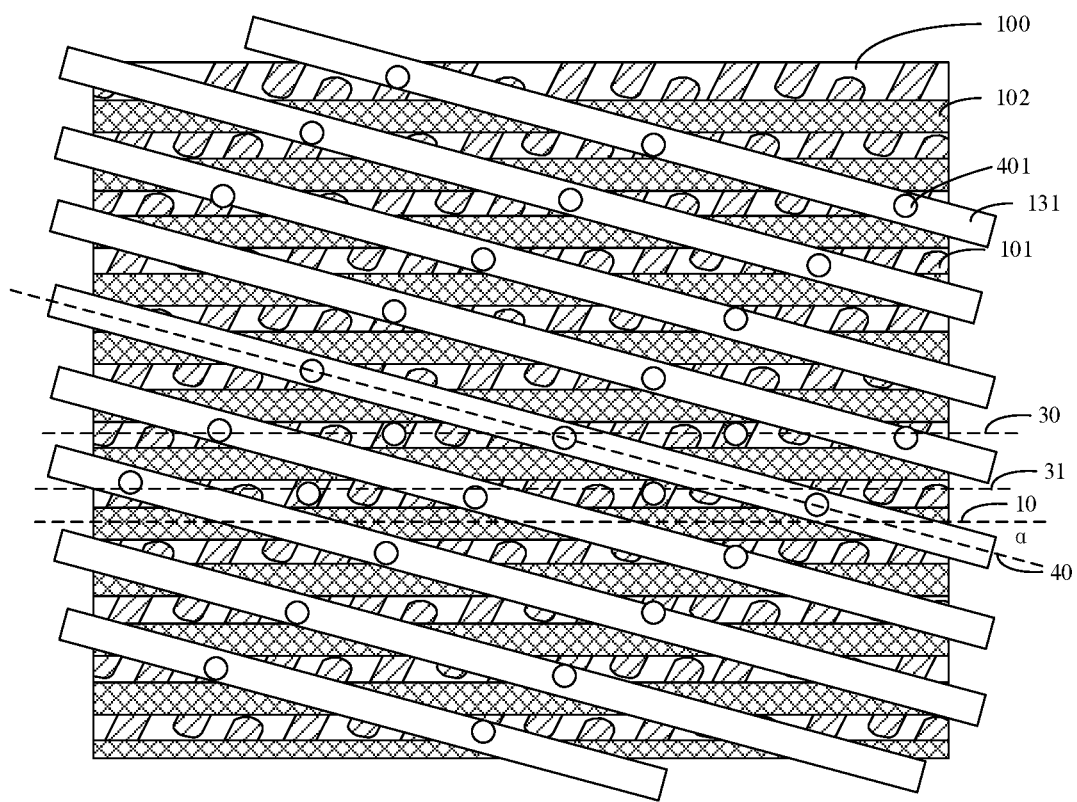
FIG. 7 illustrates a seventh structure diagram corresponding to one or more steps of a method for forming a memory according to the first embodiment of the disclosure.

The first photolithographic mask layer 130 is patterned based on the photoresist. Referring to FIG. 7, the first photolithographic mask layer 130 is patterned to form the spaced patterns 131 in the first preset direction, the first preset direction forming an included angle α with the extension direction 10 of the word line structure, and a range of a being $0°<α<90°$ (the included angle α between straight lines refers to an included angle between a straight line 40 and the straight line 10, and if it is an included angle of rays, the range of a is $0°<α<360°$, $α≠90°$, $α≠180°$, and $α≠270°$. The embodiment is illustrated with the condition that a is 25° as an instance. In another embodiment, a may be 10°, 20°, 30°, 40°, 50°, 60°, 70°, 80°, etc. In the figure, the circles 401 represent the bit line contact points covered by the spaced patterns 131. It can be seen by those skilled in the art that the bit line contact points covered by the spaced patterns 131 and the bit line contact points not covered by the spaced patterns 131 are alternately arranged in sectional directions of the dotted line 30 and the dotted line 31.

It is to be noted that, in the embodiment, the spaced patterns 131 are exemplarily described with spaced and extending strips as an instance. In another embodiment, the spaced patterns 131 may also be separate ellipses or rectangles.

Figure 8:
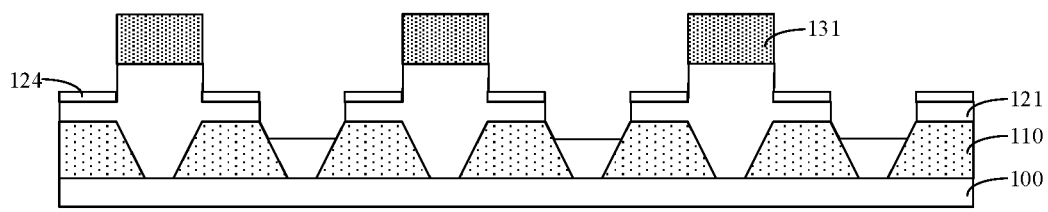
FIG. 8 illustrates an eighth structure diagram corresponding to one or more steps of a method for forming a memory according to the first embodiment of the disclosure.

Referring to FIG. 8, part of the bit line contact layer 120 is etched based on the spaced patterns 131, the remaining bit line contact layer 121 includes the first remaining bit line contact layer 1211 above the bottom dielectric layer 110 and the second remaining bit line contact layer 1212 above the active regions, and the first remaining bit line contact layer 1211 above the bottom dielectric layer 110 and the second remaining bit line contact layer 1212 above the active regions have different heights, and the second remaining bit line contact layer 1212 above the active regions includes a first portion AC1 above part of the active regions and a second portion AC2 above the remainder of the active regions, the first portion AC1 above part of the active regions and the second portion AC2 above the remainder of the active regions are arranged at two sides of the bottom dielectric layer 110 respectively and the height of the first portion AC1 above part of the active regions is different from the height of the second portion AC2 above the remainder of the active regions.

Figure 9:
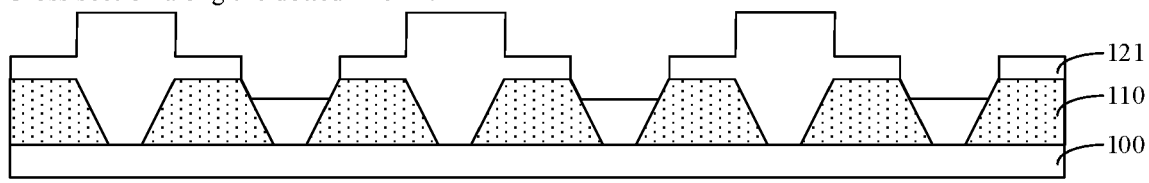
FIG. 9 illustrates a ninth structure diagram corresponding to one or more steps of a method for forming a memory according to the first embodiment of the disclosure.
Figure 9:
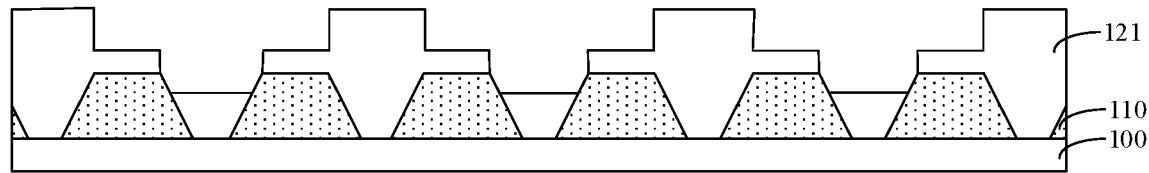

Referring to FIG. 9, the spaced patterns 131 and the barrier layers 124 are removed.

In the figure, the direction of the dotted line 30 and the direction of the dotted line 31 are two sectional positions presented in FIG. 3, and are used for those skilled in the art to understand the principle of the disclosure.

FIG. 9 is a schematic section view in the direction of the dotted line 30 and the direction of the dotted line 31. In the direction perpendicular to the extension direction 10 of the word line structure (the same vertical position in the two figures), the remaining bit line contact layer 121 has different heights at the bottom dielectric layer and the active regions, the remaining bit line contact layer 121 includes the first remaining bit line contact layer 1211 above the bottom dielectric layer 110 and the second remaining bit line contact layer 1212 above the active regions, and the first remaining bit line contact layer 1211 above the bottom dielectric layer 110 and the second remaining bit line contact layer 1212 above the active regions have different heights, and the second remaining bit line contact layer 1212 above the active regions includes a first portion AC1 above part of the active regions and a second portion AC2 above the remainder of the active regions, the first portion AC1 above part of the active regions and the second portion AC2 above the remainder of the active regions are arranged at two sides of the bottom dielectric layer 110 respectively and the height of the first portion AC1 above part of the active regions is different from the height of the second portion AC2 above the remainder of the active regions. In the extension direction 10 of the word line structure (the shown sectional direction), the remaining bit line contact layer 121 has different heights at the bottom dielectric layer 110 and the active regions, and protruding portions at a first height and sunken portions at a second height in the remaining bit line contact layer 121 at the bit line contact openings 111 are alternately arranged.

In another embodiment, masks may further be continued to be formed. The bit line contact layers at different heights are further etched to ensure that heights of the top surfaces of the left bit line contact layers may be alternately arranged according to a preset height sequence.

Figure 10:
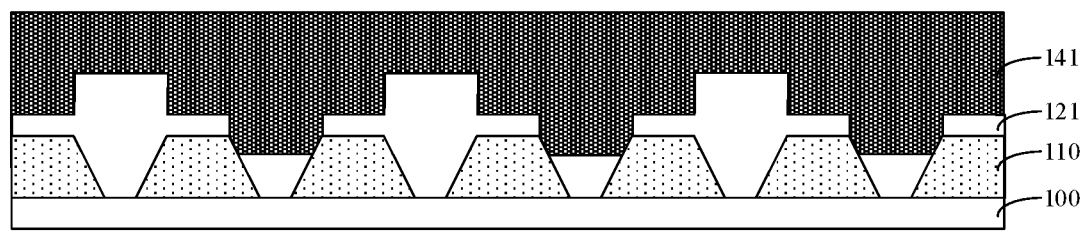
FIG. 10 illustrates a tenth structure diagram corresponding to one or more steps of a method for forming a memory according to the first embodiment of the disclosure.
Figure 11:
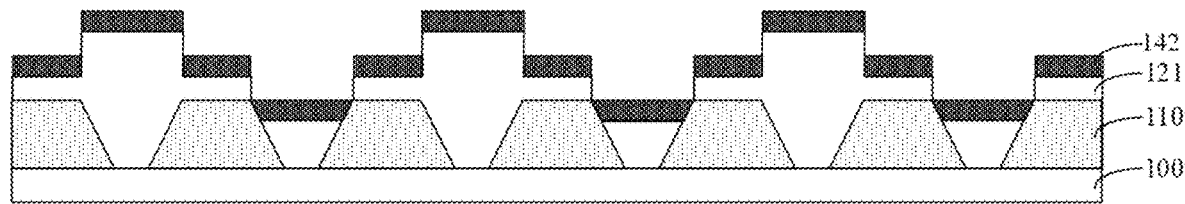
FIG. 11 illustrates an eleventh structure diagram corresponding to one or more steps of a method for forming a memory according to the first embodiment of the disclosure.

Referring to FIG. 10 to FIG. 11, conducting layers 142 are formed on the top surface of the remaining bit line contact layer 121 at different heights.

Specifically, referring to FIG. 10, conducting film 141 is formed on the top surface of the remaining bit line contact layer 121 at different heights.

Referring to FIG. 11, the conducting film 141 is etched (referring to FIG. 10) to form the conducting layers 142 with the same thickness on the top surfaces of the remaining bit line contact layer 121 at different heights. The conducting layers 142 with the same thickness are formed to ensure that the conducting layers 142 on the top surface of the remaining bit line contact layer 121 at different heights are at different heights.

In another embodiment, the conducting layers on the top surfaces of the remaining bit line contact layer at different heights may have different thicknesses, but it is necessary to ensure that the top surfaces of the conducting layers are at different heights, so that the connecting line of the conducting layers between different bit line structures is an oblique line, and distances between the conducting layers of the bit line structures are increased without changing an arrangement manner for the bit line structures.

In the direction perpendicular to the extension direction 10 of the word line structure, the top surfaces of the formed conducting layers 142 are at different heights, and the connecting line is a wavy shape, this means the height of the conducting layer in a same bit line structure waving up and down perpendicular to the plane of the substrate in an extension direction of the bit line structure. In the extension direction 10 of the word line structure, the top surfaces are at different heights, and the connecting line is a wavy shape.

In the embodiment, the conducting layer 142 is formed from one conducting material or more conducting materials, for example, doped with polysilicon, titanium, titanium nitride, tungsten, and a composite of tungsten.

Figure 12:
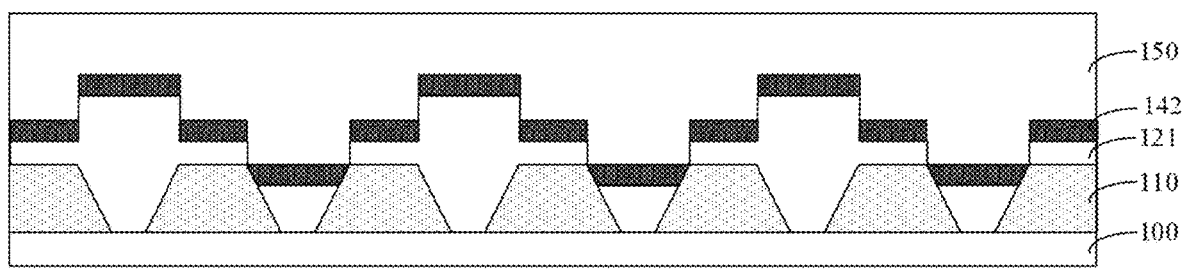
FIG. 12 illustrates a twelfth structure diagram corresponding to one or more steps of a method for forming a memory according to the first embodiment of the disclosure.

Referring to FIG. 12, top dielectric layer 150 are formed on top surfaces of the conducting layers 142.

Specifically, a top dielectric film is formed on the top surfaces of the conducting layers, and a surface of the top dielectric film is planarized to form the top dielectric layer 150, the top surface of the top dielectric layer 150 being at a same height.

Specifically, the top surfaces of the top dielectric film are planarized in a chemical mechanical polishing manner. Compared with an etching process, a chemical mechanical polishing process is higher in removal rate and favorable for shortening the process cycle.

In the embodiment, a material for the top dielectric layer 150 includes silicon nitride, silicon oxynitride, silicon oxide, etc. In the embodiment, the material for the top dielectric layer 150 is a nitrogen-containing insulating material, namely silicon nitride is used for the top dielectric layer 150.

Figure 13:
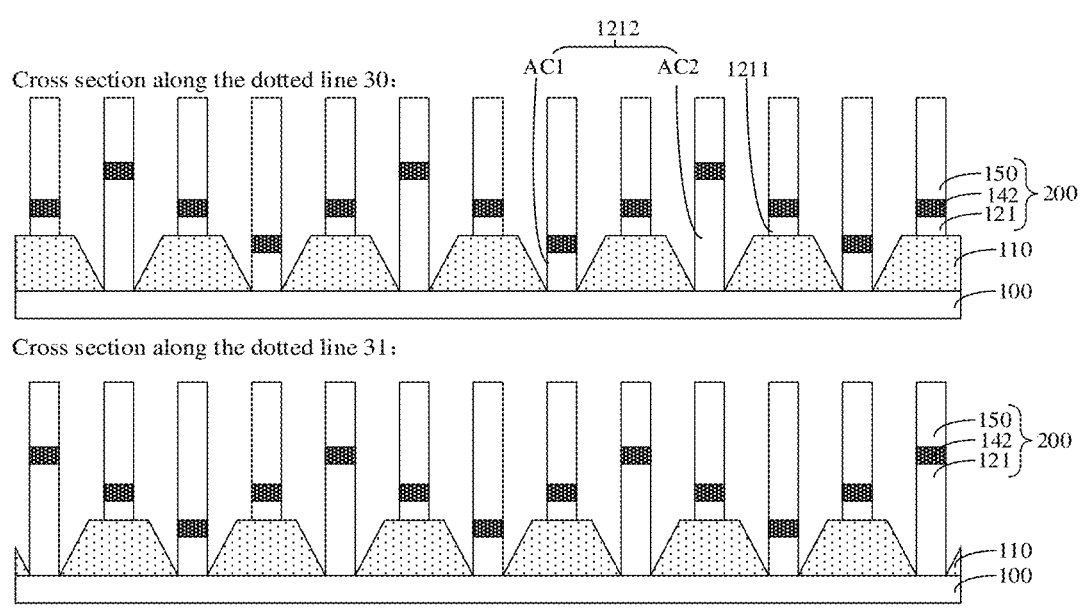
FIG. 13 illustrates a schematic sectional view of a memory formed according to the first embodiment of the disclosure.

Referring to FIG. 13, the top dielectric layer 150, the conducting layers 142 and the remaining bit line contact layer 121 at different heights are sequentially etched to form separate bit line structures 200, the remaining bit line contact layer 121 includes the first remaining bit line contact layer 1211 above the bottom dielectric layer 110 and the second remaining bit line contact layer 1212 above the active regions, and the first remaining bit line contact layer 1211 above the bottom dielectric layer 110 and the second remaining bit line contact layer 1212 above the active regions have different heights, and the second remaining bit line contact layer 1212 above the active regions includes a first portion AC1 above part of the active regions and a second portion AC2 above the remainder of the active regions, the height of the first portion AC1 above part of the active regions is different from the height of the second portion AC2 above the remainder of the active regions.

In the direction perpendicular to the extension direction 10 of the word line structures and the plane of the substrate, the connecting line of the conducting layers 142 in the separate bit line structures 200 is a wavy shape. In the extension direction 10 of the word line structures, the conducting layers 142 in adjacent separate bit line structures 200 are at different heights, and the connecting line of the conducting layers 142 is a wavy shape.

The method for forming a memory provided in the some embodiments of the disclosure can have one or more of the following advantages.

The remaining bit line contact layer having different heights at the bottom dielectric layer and the active regions is formed to make the conducting layers formed on the top surfaces of the remaining bit line contact layer at different heights. The top surfaces of the conducting layers are at the same height in the direction perpendicular to the extension direction of the word line structures, and the top surfaces of the conducting layers are at different heights in the extension direction of the word line structures. That is, in the separate bit line structures that are subsequently formed, the conducting layers in the same bit line structure are at different heights, and the conducting layers in different bit line structures are at different heights. The conducting layers in adjacent separate bit line structures are formed at different heights without changing an arrangement manner for the bit line structures, and compared with the conducting layers at the same height, distances between the conducting layers at different heights change from horizontal distances to oblique distances, so that the distances between the conducting layers in the bit line structures are increased, furthermore, the parasitic capacitance between the bit line structures is reduced, and a saturation current of the memory is increased. In addition, the method for forming a memory provided in the embodiments is simple in flow, relatively low in cost, and easy to implement.

The above steps are divided only for clear description. During implementation, the steps can be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Figure 14:
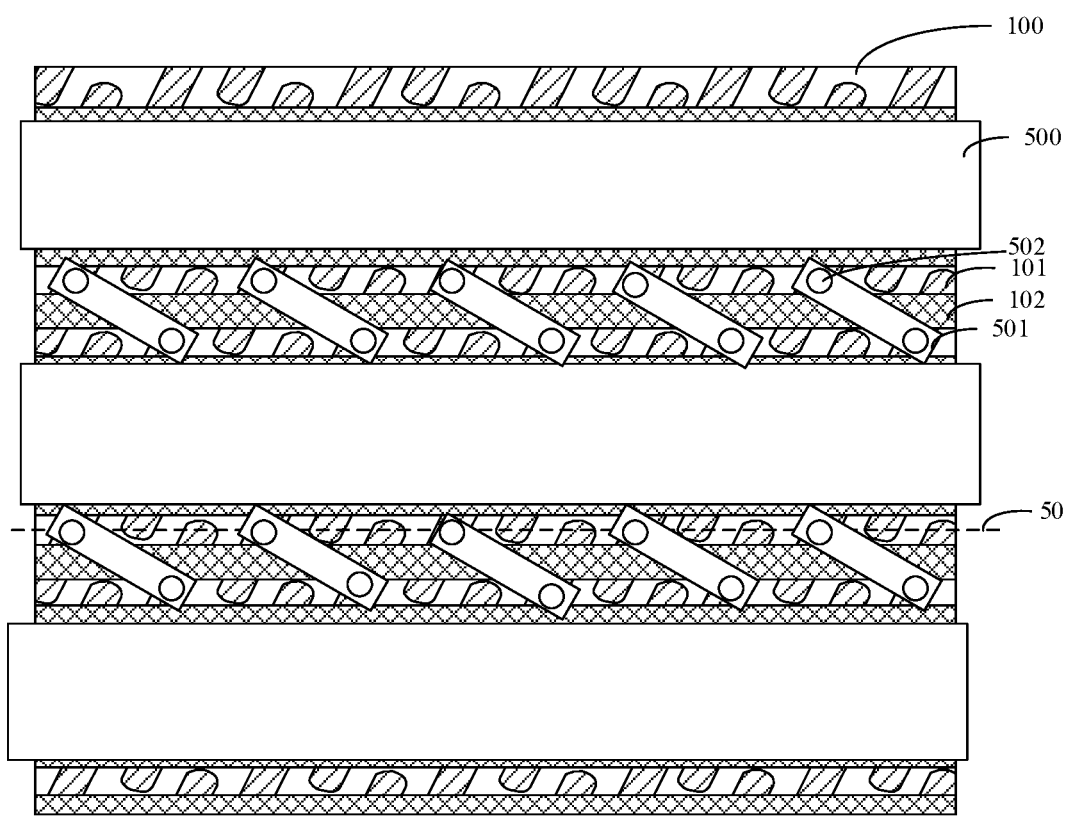
FIG. 14 illustrates a structure diagram corresponding to another patterning manner in a method for forming a memory according to a second embodiment of the disclosure.
Figure 15:
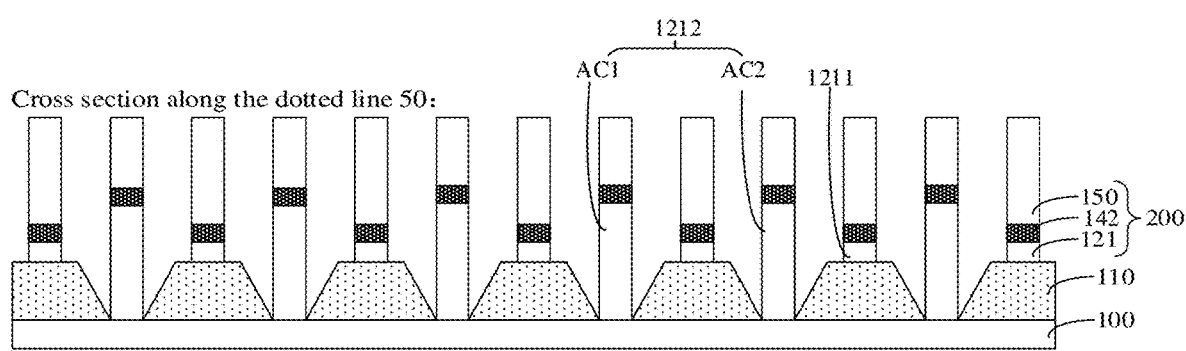
FIG. 15 illustrates a schematic sectional view of a memory formed according to the second embodiment of the disclosure.

A second embodiment of the disclosure relates to a method for forming a memory. The difference from the first embodiment is that the embodiment provides another manner for forming photolithographic masks. Referring to FIG. 14 and FIG. 15, the method for forming a memory of the embodiment will be specifically described below.

Second photolithographic mask layers are formed on the top surfaces of the bit line contact layer.

The embodiment provides two manners for forming the second photolithographic mask layers, specifically as follows.

The first manner for forming second photolithographic mask layers 500: the formed second photolithographic mask layer 500 is in the extension direction 10 of the word line structure, there are gaps formed between adjacent second photolithographic mask layers 500 in the direction perpendicular to the extension direction 10 of the word line structure, and spaces between at least two columns of word line structures 102 and part of the bit line contact layer 120 exposed from the gaps.

The second manner for forming second photolithographic mask layers 501: the second photolithographic mask layers 501 are formed, the second photolithographic mask layer 501 covering the two bit line contact points 502 in the space between the two columns of word line structures 102, and the second photolithographic mask layers 501 being sequentially arranged in the extension direction 10 of the word line structure.

In the embodiment, the second manner for forming the second photolithographic mask layers 501 is used, part of the bit line contact layer is etched based on the gaps to form the remaining bit line contact layer having different heights at the bottom dielectric layer and the active regions, the remaining bit line contact layer 121 includes the first remaining bit line contact layer 1211 above the bottom dielectric layer 110 and the second remaining bit line contact layer 1212 above the active regions 101, and the first remaining bit line contact layer 1211 above the bottom dielectric layer 110 and the second remaining bit line contact layer 1212 above the active regions 101 have different heights, and the second remaining bit line contact layer 1212 above the active regions 101 includes a first portion AC1 above part of the active regions 101 and a second portion AC2 above the remainder of the active regions 101, the first portion AC1 above part of the active regions 101 and the second portion AC2 above the remainder of the active regions 101 are arranged at two sides of the bottom dielectric layer 110 respectively and the height of the first portion AC1 above part of the active regions 101 is equal to the height of the second portion AC2 above the remainder of the active regions 101, and then the second photolithographic mask layers are removed. The other process steps are the same as the first embodiment. The bit line structure 200 formed according to the method for forming a mask provided in the embodiment refers to the sectional view along the direction of the dotted line 50 in FIG. 15.

The conducting layers in the bit line structures 200 formed in the bit line contact points covered by the second photolithographic mask layers are relatively high, and the conducting layers in the bit line structures 200 formed in the bit line contact points not covered by the second photolithographic mask layers are relatively low (not shown in the figure). In such case, the conducting layers in the bit line structures 200 on the bit line contact points are at the same height in the direction perpendicular to the extension direction 10 of the word line structure. However, since the barrier layers are formed in the bit line contact layers, the bit line structures on the bottom dielectric layer 110 and the bit line structures on the bit line contact points are at different heights. In such case, in the extension direction 10 of the word line structure, the remaining conducting layer in different bit line structures 200 are at different heights. In the extension direction 20 of the bit line structure, the conducting layers in the same bit line structure 200 are at different heights due to the distribution of the second photolithographic mask layers.

The method for forming a memory provided in the second embodiment of the disclosure can have one or more of the following advantages.

The remaining bit line contact layer having different heights at the bottom dielectric layer and the active regions is formed to make the conducting layers formed on the top surface of the remaining bit line contact layer at different heights. The top surfaces of the conducting layers are at the same height in the direction perpendicular to the extension direction of the word line structure, and the top surfaces of the conducting layers are at different heights in the extension direction of the word line structure. That is, in the separate bit line structures that are subsequently formed, the conducting layers in the same bit line structure are at different heights and the conducting layers in different bit line structures are at different heights. The conducting layers in adjacent separate bit line structures are formed at different heights without changing an arrangement manner for the bit line structures, and compared with the conducting layers at the same height, distances between the conducting layers at different heights change from horizontal distances to oblique distances, so that the distances between the conducting layers in the bit line structures are increased, furthermore, the parasitic capacitance between the bit line structures is reduced, and a saturation current of the memory is increased. In addition, the method for forming a memory provided in the embodiments is simple in flow, relatively low in cost, and easy to implement.

The first embodiment corresponds to the present embodiment, so that the present embodiment can be matched with the first embodiment for implementation. The related technical details mentioned in the first embodiment are still effective in the present embodiment, and the technical effects that may be achieved in the first embodiment may also be achieved in the present embodiment. For reducing repetitions, elaborations are omitted herein. Correspondingly, related technical details mentioned in the present embodiment may also be applied to the first embodiment.

A third embodiment of the disclosure relates to a memory. Referring to FIG. 13, the memory provided in the embodiment will be described below in detail in combination with the drawing. Parts the same as or corresponding to the first embodiment will not be elaborated below.

The memory includes: a substrate 100, at least word line structures 102 and active regions 101 being included in the substrate 100; a bottom dielectric layer 110, the bottom dielectric layer 110 being at a top of the substrate 100, bit line contact openings 111 being provided in the bottom dielectric layer 110; and separate bit line structures 200, top surfaces of the bit line structures 200 being at the same height, and the bit line structure 200 including a bit line contact layer 121 at a top of the bottom dielectric layer 110 and in the bit line contact opening 111, a conducting layer 142 at a top of the bit line contact layer 121, and a top dielectric layer 150 at a top of the conducting layer 142. The conducting layer 142 in the same bit line structure is a wavy shape in an extension direction 20 of the bit line structure 200, and the conducting layers 142 in adjacent bit line structures are at different heights and the connecting line of the conducting layers in different bit line structures is a wavy shape in an extension direction 10 of the word line structure 102.

It is to be noted that other memory structures, except the word line structures 102 and the active regions 101, are also included in the substrate 100, such as shallow trench isolation structures, etc. The other memory structures do not involve the core technology of the disclosure, and will not be elaborated herein. Those skilled in the art can understand that the other memory structures for normal running of the memory, except the word line structures 102 and the active regions 101, may also be included in the substrate 100.

In the embodiment, the conducting layers 142 have the same thickness. In another embodiment, the conducting layers 142 on the top surface of the bit line contact layer 121 at different heights may have different thicknesses, but it is necessary to ensure that the top surfaces of the conducting layers 142 are at different heights, so that the connecting line of the conducting layers between different bit line structures is an oblique line, and distances between the conducting layers of the bit line structures are increased without changing an arrangement manner for the bit line structures.

In the embodiment, a connecting line of the conducting layer 142 is a wavy shape in the extension direction 20 of the bit line structure, namely the conducting layer 142 in the same bit line structure 200 is at different heights, the conducting layer 142 in the same bit line structure 200 waving up and down perpendicular to the plane of the substrate 100 in an extension direction of the bit line structure 200. The conducting layers 142 in different bit line structures 200 are at the same height in a second preset direction, the second preset direction forming an included angle $\beta$ with the extension direction 10 of the word line structure 102, and a range of $\beta$ being $0°<\beta<90°$ (the included angle $\beta$ between straight lines refers to an included angle between a straight line 40 and the straight line 10, and if it is an included angle of rays, the range of $\beta$ is $0°<\beta<360°$, $\beta\neq90°$, $\beta\neq180°$, and $\beta\neq270°$, as shown in FIG. 3.

Various embodiments of the present application can have one or more of the following advantages.

Through the bit line contact layers at different heights, the conducting layers on the top surfaces of the bit line contact layers are at different heights. The top surfaces of the conducting layers are at the same height in the direction perpendicular to the extension direction of the word line structure, and the top surfaces of the conducting layers are at different heights in the extension direction of the word line structure. That is, in the separate bit line structures that are subsequently formed, the conducting layers in the same bit line structure are at different heights, and the conducting layers in different bit line structures are at different heights. The conducting layers in adjacent separate bit line structures are formed at different heights without changing an arrangement manner for the bit line structures, and compared with the conducting layers at the same height, distances between the conducting layers at different heights change from horizontal distances to oblique distances, so that the distances between the conducting layers in the bit line structures are increased, furthermore, the parasitic capacitance between the bit line structures is reduced, and a saturation current of the memory is increased. In addition, the method for forming a memory provided in the embodiments is simple in flow, relatively low in cost, and easy to implement.

The first embodiment corresponds to the present embodiment, so that the present embodiment can be matched with the first embodiment for implementation. The related technical details mentioned in the first embodiment are still effective in the present embodiment, and the technical effects that may be achieved in the first embodiment may also be achieved in the present embodiment. For reducing repetitions, elaborations are omitted herein. Correspondingly, related technical details mentioned in the present embodiment may also be applied to the first embodiment.

Those of ordinary skill in the art can understand that each embodiment is a specific example implementing the disclosure, and in practical applications, various variations about the form and details can be made thereto without departing from the spirit and scope of the disclosure.

What is claimed is:

1. A method for forming a memory, comprising:
providing a substrate, in which at least word line structures and active regions are included;
forming the bottom dielectric layer with bit line contact openings, the bit line contact openings exposing the active regions in the substrate;
forming a bit line contact layer, the bit line contact layer covering the bottom dielectric layer and filling the bit line contact openings;
etching the bit line contact layer to form a remaining bit line contact layer, wherein the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights;
forming conducting layers on top surfaces of the remaining bit line contact layer, top surfaces of the conducting layers being at different heights in a direction perpendicular to an extension direction of the word line structures and a plane of the substrate, and the top surfaces of the conducting layers being at different heights in the extension direction of the word line structures;
forming a top dielectric layer on the top surfaces of the conducting layers; and
sequentially etching the top dielectric layer, the conducting layers and the remaining bit line contact layer to form separate bit line structures; wherein
etching the bit line contact layer to form a remaining bit line contact layer, wherein the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights comprises:
forming first photolithographic mask layer on the top surface of the bit line contact layer;
patterning the first photolithographic mask layer to form spaced patterns extending in a first preset direction, the first preset direction forming an included angle α with the extension direction of the word line structures, and a range of α being 0°<α<90°;
etching the bit line contact layer based on the spaced patterns, the remaining bit line contact layer above the bottom dielectric layer is the first remaining bit line contact layer and the remaining bit line contact layer above the active regions is the second remaining bit line contact layer, wherein the first remaining bit line contact layer above the bottom dielectric layer and the second remaining bit line contact layer above the active regions have different heights; and removing the spaced patterns; or
forming second photolithographic mask layers on a top surface of the bit line contact layer, the second photolithographic mask layers being in the extension direction of the word line structures, and there being gaps formed between adjacent second photolithographic mask layers in the direction perpendicular to the extension direction of the word line structures, wherein the gap exposes part of the bit line contact layer and spaces between at least two columns of word line structures;
etching part of the bit line contact layer based on the gaps, wherein the remaining bit line contact layer above the bottom dielectric layer is the first remaining bit line contact layer and the remaining bit line contact layer above the active regions is the second remaining bit line contact layer, wherein the first remaining bit line contact layer above the bottom dielectric layer and the second remaining bit line contact layer above the active regions have different heights; and
removing the second photolithographic mask layers.

2. The method for forming a memory of claim 1, wherein the spaced patterns comprise spaced and extending strips, or separate ellipses or rectangles.

3. The method for forming a memory of claim 1, wherein forming the conducting layers on the top surfaces of the remaining bit line contact layer comprises:
forming a conducting film on the top surfaces of the remaining bit line contact layer;
and etching the conducting film to form the conducting layers with a same thickness on the top surfaces of the remaining bit line contact layer.

4. The method for forming a memory of claim 1, wherein forming the top dielectric layer on the top surfaces of the conducting layers comprises:
forming a top dielectric film on the top surfaces of the conducting layers; and
planarizing a top surface of the top dielectric film to form the top dielectric layer.

5. The method for forming a memory of claim 1, wherein forming bit line contact layer, the bit line contact layer covering the bottom dielectric layer and filling the bit line contact openings comprises:

forming a first bit line contact layer filling the bit line contact openings, the first bit line contact layer covering the bottom dielectric layer;

forming a barrier layer on a top surface of the first bit line contact layer at a top of the bottom dielectric layer; and forming a second bit line contact layer on a top surface of the barrier layer and the top surface of the first bit line contact layer, the second bit line contact layer covering the first bit line contact layer and the barrier layer.

6. A memory, comprising:

a substrate, at least word line structures and active regions being included in the substrate;

a bottom dielectric layer, the bottom dielectric layer being at a top surface of the substrate, bit line contact openings being provided in the bottom dielectric layer; and separate bit line structures, top surfaces of the bit line structures being at the same height, and each bit line structure comprising a bit line contact layer at a top surface of the bottom dielectric layer and in the bit line contact opening, a conducting layer at a top surface of the bit line contact layer, and a top dielectric layer at a top surface of the conducting layer, wherein a height of the conducting layer in a same bit line structure waves up and down perpendicular to the plane of the substrate in an extension direction of the bit line structure, and the conducting layers in adjacent bit line structures are at different heights and a connecting line of the conducting layers in different bit line structures is a wavy shape in an extension direction of the word line structures;

wherein the memory is prepared with steps of:

providing a substrate, in which at least word line structures and active regions are included; forming the bottom dielectric layer with bit line contact openings, the bit line contact openings exposing the active regions in the substrate;

forming a preliminary bit line contact layer, the preliminary bit line contact layer covering the bottom dielectric layer and filling the bit line contact openings;

etching the preliminary bit line contact layer to form a remaining bit line contact layer, wherein the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights;

forming conducting layers on top surfaces of the remaining bit line contact layer, top surfaces of the conducting layers being at different heights in a direction perpendicular to an extension direction of the word line structures and a plane of the substrate, and the top surfaces of the conducting layers being at different heights in the extension direction of the word line structures;

forming a top dielectric layer on the top surfaces of the conducting layers; and sequentially etching the top dielectric layer, the conducting layers and the remaining bit line contact layer to form separate bit line structures; wherein etching the preliminary bit line contact layer to form a remaining bit line contact layer, wherein the remaining bit line contact layer includes a first remaining bit line contact layer above the bottom dielectric layer and a second remaining bit line contact layer above the active regions, and the first remaining bit line contact layer above the bottom dielectric layer and the second remaining bit line contact layer above the active regions have different heights comprises:

forming first photolithographic mask layer on a top surface of the bit line contact layer;

patterning the first photolithographic mask layer to form spaced patterns extending in a first preset direction, the first preset direction forming an included angle $\alpha$ with the extension direction of the word line structures, and a range of a being $0°<\alpha<90°$;

etching the preliminary bit line contact layer based on the spaced patterns to form the remaining bit line contact layer, the remaining bit line contact layer above the bottom dielectric layer is the first remaining bit line contact layer and the remaining bit line contact layer above the active regions is the second remaining bit line contact layer, wherein the first remaining bit line contact layer above the bottom dielectric layer and the second remaining bit line contact layer above the active regions have different heights; and removing the spaced patterns; or forming second photolithographic mask layers on a top surface of the preliminary bit line contact layer, the second photolithographic mask layers being in the extension direction of the word line structures, and there being gaps formed between adjacent second photolithographic mask layers in the direction perpendicular to the extension direction of the word line structures, wherein the gap exposes part of the preliminary bit line contact layer and spaces between at least two columns of word line structures;

etching part of the preliminary bit line contact layer based on the gaps to form the remaining bit line contact layer, the remaining bit line contact layer above the bottom dielectric layer is the first remaining bit line contact layer and the remaining bit line contact layer above the active regions is the second remaining bit line contact layer, wherein the first remaining bit line contact layer above the bottom dielectric layer and the second remaining bit line contact layer above the active regions have different heights; and removing the second photolithographic mask layers.

7. The memory of claim 6, wherein the conducting layers in different bit line structures are at a same height in a second preset direction, the second preset direction forming an included angle $\beta$ with the extension direction of the word line structure, and a range of $\beta$ being $0°<\beta<90°$.

* * * * *